United States Patent [19]

Lifshin et al.

[11] 4,383,003

[45] May 10, 1983

[54] TRANSFER LAMINATION OF COPPER THIN SHEETS AND FILMS, METHOD AND PRODUCT

[75] Inventors: Eric Lifshin, Loudonville; Joseph D. Cargioli, Schenectady; Stephen J. Schroder, Schenectady; Joe Wong, Schenectady, all of N.Y.

[73] Assignee: General Electric Company, Schenectady, N.Y.

[21] Appl. No.: 189,003

[22] Filed: Sep. 22, 1980

[51] Int. Cl.³ ............................................ B32B 15/20
[52] U.S. Cl. .................................. 428/611; 428/623; 428/624; 428/631; 428/32; 428/658; 428/674; 174/68.5
[58] Field of Search ............... 428/548, 606, 607, 611, 428/620, 623, 629, 632, 633, 646, 647, 657, 658, 664, 666, 650, 652, 674, 630, 631; 174/68.5

[56] References Cited

U.S. PATENT DOCUMENTS

| 2,916,400 | 12/1959 | Homer et al. | 428/938 |
| 3,237,271 | 3/1966 | Arnold et al. | 428/620 |
| 3,857,681 | 12/1974 | Yates et al. | 29/195 |
| 3,984,598 | 10/1976 | Sarazin et al. | 428/336 |
| 4,049,481 | 9/1977 | Morisaki | 428/658 |
| 4,153,518 | 5/1979 | Holmes et al. | 428/633 |
| 4,193,849 | 3/1980 | Sato | 204/38 B |

OTHER PUBLICATIONS

Pellegrino news item, (Electronics Packaging and Production, vol. 18, No. 11, p. 125, Nov. 1978).

"Growth and Perfection of Crystals" by R. H. Doremus, B. W. Roberts and David Turnbull, (Proceedings of an International Conference on Crystal Growth, held at Cooperstown, N.Y., Aug. 27-29, 1958), pp. 26, 27 and 28.

"Adhesion of Electroformed Copper and Nickel to Plastic Laminates", (Transactions of the Institute of Metal Finishing) by D. J. Arrowsmith, (vol. 48, p. 88, 1970).

Primary Examiner—Michael L. Lewis
Attorney, Agent, or Firm—Leo I. MaLossi; James C. Davis, Jr.; James Magee, Jr.

[57] ABSTRACT

A copper-clad laminate having special utility in the production of high resolution printed circuit patterns by either subtractive or semi-additive processing is made by vapor depositing a film of zinc on a copper film on a silica-coated aluminum carrier sheet, vapor depositing a silica film on the resulting zinc-copper foil, bonding the resulting body to a substrate and then stripping the silica-coated aluminum carrier sheet from the copper-clad laminate.

6 Claims, 7 Drawing Figures

TRANSFER LAMINATION OF COPPER THIN SHEETS AND FILMS, METHOD AND PRODUCT

CROSS REFERENCE

The present invention is related to that disclosed and claimed in our co-pending Patent Application Ser. No. 180,341, filed Aug. 22, 1980 entitled "Transfer Lamination of Vapor Deposited Foils", and assigned to the assignee hereof. Thus, the extremely smooth, virtually pinhole-free and very fine-grained copper surfaces of the copper-clad laminates produced by the process of that invention are features of importance in the products of the preferred practice of the present invention.

DEFINITIONS

As used herein, and in the appended claims, the term "carrier" includes aluminum sheet material which is of gauge thickness such that it can be run through a processing line and rolled for storage or shipment, and also includes such sheet material of other metals as well as of plastics, such as duPont commercial products known as MYLAR and KAPTON and other organic polymeric materials of similar flexibility which will withstand the processing temperatures involved in this invention and have the strength at the temperature of deposition of the copper film and the characteristics of inertness and bondability to release agent coatings necessary for coating adherence as copper-clad laminate products are stripped from the carrier sheets.

Likewise, by the term "release agent" we mean and include oxides in which the diffusivity of copper atoms is negligible under time and temperature conditions comparable to one atmosphere at 175 degrees C. Further, these are materials which will not bond to cooper or other metal deposited as a film thereon as strongly as to the aluminum or other carrier sheet material and further will serve to prevent interdiffusion and also reaction between the copper film and the aluminum sheet or other carrier under conditions of production or use.

"Ultra-thin" designates thickness less than about 16 microns.

"Film" and "foil" in this same context mean respectively an ultra-thin coating and the combination of such coating and one or more ultra-thin coatings of another metal or material.

"Vapor deposition" means and includes sputtering, physical evaporation (i.e., electron beam, inductive and/or resistive evaporation), chemical vapor deposition, and ion plating.

"Substrate" as that term is used in this specification and the appended claims means and refers to that part of the copper-clad laminate product or other article of manufacture of this invention which serves as the physical support means for the metal film or foil being suitably a glass-epoxy body provided in the form of a prepreg for cure in contact with copper or other metal foil. Other materials useful for this purpose include, but are not limited to, that known in the trade as "phenolic paper resins" which are paper sheet products impregnated with a resin curable to provide an adhesive bond between the substrate and the metal foil of the laminate. Still other such materials are polyimides and polyester resins.

"Thin copper sheet" as used herein designates a self-supporting roller or electrodeposited copper sheet of thickness up to about 80 microns.

"Coupling agent" is used herein in accordance with usage of that term in the art and thus means in particular those various hydrolyzable organo-silane esters having the capability of forming chemical bonds with both energy resins and silica.

BACKGROUND AND SUMMARY OF INVENTION

This invention concerns the fabrication of copper-clad laminates useful in the production of printed circuit boards and, more particularly, it concerns itself with a novel method for producing such laminates and improved laminate products, as well as novel intermediate products.

Copper-clad laminate is one of the starting materials used in the production of printed circuit boards. Such a laminate consists of a substrate having a foil of copper firmly adhered thereto. Producers of printed circuit board (PCB) products apply the desired circuit patterns in different ways. The most common method, known as subtractive processing, involves masking the desired pattern by a photo-resist or screen printed masking material on the copper-clad laminate and then removing the undesired copper cladding by etching.

Another method for producing circuit patterns requires the use of a substrate clad with ultra-thin copper. Masking is applied as described above. However, the copper is exposed in the area in which the circuit pattern is desired. Electrodeposition is then performed increasing the circuit line thickness after which the masking and thin background copper are removed by etching. This approach is known as the semi-additive method.

It is desirable, of course, to produce PCB's having the maximum number of circuit lines contained thereon. The more circuit lines, and consequently, the more components, that can be fit on to a single board, the more compact and economical the product becomes. One of the limiting factors, however, in the number of circuit lines that can be applied in a given amount of space is the degree of fineness with which such lines can be produced. Another limitation is the degree of precision with which the lines themselves and the spaces between them can be defined.

Those skilled in the art realize that it is desirable in light of the foregoing objectives and for other reasons to use relatively thin foils in the production of the basis laminate product which is to be used in the production of PCB's. With the subtractive process applied to thicker foils, there is greater wastage of copper when the background foil is etched away, as described above. Also, there is necessarily a certain amount of side etching of the circuit lines themselves, reducing the amount of current carrying material and altering the surface morphology of the circuit lines. Obviously, this gives rise to a further limitation in how closely the circuit lines can be spaced from one another. Where semi-additive processing of laminates clad with thin copper foil is used, these disadvantages are clearly minimized.

Foils for copper-clad laminates have been produced for the most part by electrodeposition up to the present time. This process has many advantages, including speed of production, economy and a very fully developed technology associated with it. There are, however, certain limitations inherent in the electrodeposition process when this technology is extended to the production of ultra-thin copper foils. For one thing, there is growing concern about its environmental impact. For another, it is very difficult to produce foils of less than 16 microns thickness which are free of pinholes. The pinholes appearing in thinner electrodeposited foils result in our opinion from the presence of impurities or defects at random locations on the surface of the electrode upon which deposition is occurring or as a result of entrapment of impurities inherent in the electrodeposition process. These impurities thus prevent electrodeposition at those locations creating pinholes which may close only when a certain thickness is achieved. Furthermore, should one produce a substantially pinhole-free ultra-thin film electrolytically, that film will inherently be of relative large grain size. With ultra-thin films, particularly those in the very thinnest ranges, the average depth of the grain boundaries begins to approximate the thickness of the films themselves. Since some organic impurities will generally be collected at points in those boundaries, there is a possible weakening of such films at those points.

Bonding of such ultra-thin films in whatever manner to suitable substrates as laminates suited for PCB production can be accomplished with consistent success in the manner disclosed and claimed in our co-pending Patent Application referenced above. We have discovered, however, that the desired adherence between such copper films and their substrates can also be established without the necessity for altering the nature of the as-deposited copper film surface. In particular, we have found that through the use of ultra-thin films of one or another of certain metals in combination with a suitable oxide ultra-thin film, the desired bonding result can be produced. Thus, an ultra-thin film of such metal is provided on the copper film and is over-coated with an ultra-thin oxide film which is maintained in contact with the substrate as lamination is accomplished.

Metals suitable for use in accordance with this invention are those which are mutually soluble with copper to some extent and under the conditions of processing according to this invention can form strongly adhering oxides. Either the metal or its oxide must also be adherent to the subsequently applied oxide layer. Zinc, aluminum, tin and chromium, for instance, meet these requirements, while iron, for one, does not. Furthermore, it is desirable that the above-mentioned metals form solid solutions with copper that are readily etchable by the same etchants normally used in copper removal from printed circuit boards.

We have found that when zinc is used for copper-bonding purpose of this invention and the zinc film is established by sputtering, system conditions should be adjusted so as not to favor the formation of a brass surface.

Oxides that may be used with consistent success in the practice of this invention include silicon dioxide and aluminum oxide, i.e., $SiO_2$ and $Al_2O_3$. Further, they may be used interchangeably with the various metals stated above, but in any event should be vapor deposited for best results in carrying out this invention process.

By using the method of our above-referenced patent application to form ultra-thin copper films, one using the present invention can consistently produce copper-clad laminates of extremely smooth, virtually pinhole-free surfaces for subsequent electrodeposition of circuit lines of high integrity. In other words, the principal advantages of our invention disclosed in our said co-pending patent application are retained in full measure in the practices and the products of the present invention. Thus, in addition to the thin film or foil advantages noted above our present new process and products have important advantages over their prior art counterparts in thin sheet applications and, consequently, like the invention of our co-pending patent application, the invention of this case is not strictly limited to the production and use of laminates with ultra-thin films or foils.

Briefly described, the present invention involves in its method aspect the vapor deposition on a layer of copper up to 80 microns thick, preferably on an ultra-thin film of copper, of an ultra-thin film of metal such as zinc, aluminum, tin or chromium, and then the vapor deposition of an ultra-thin film of silica or aluminum oxide on the resulting metal film, and finally laminating the silica- or alumina-coated metal body with a substrate so as to create relatively strong adhesion between the body and the substrate. The copper layer or film can be provided by vapor deposition, rolling or by electrolytic technique, but if high-resolution printed circuit patterns are desired, the copper should be in the form of an ultra-thin film. In accordance with our preferred practice, zinc is deposited by sputtering on the copper layer or film, and then during the course of the substrate lamination step as the assembly is heated, the zinc will alloy with the copper to produce brass. Staining of the substrate by the brass as experienced in the prior art practice does not result, however, because the alumina or silica coating is an effective barrier to the migration of staining compounds into the substrate. Also, preferably, the thickness of the zinc, aluminum, tin or chromium applied to the copper film is of the order of only 1,200 to 7,000 Angstroms while the thickness of the alumina or silica film is of only 200 to 1,200 Angstroms, and is produced by sputtering.

Having observed that when zinc is sputtered to form an ultra-thin film in the presence of a small amount of moisture, the film has an irregular microscopic surface morphology characterized by the presence of fine whisker-like dendrites, and having also observed that in some instances the presence of such dendrites is associated with good to excellent substrate adherence in the ultimate laminate product, our preferred practice involves the use of a sputtering atmosphere promoting such dendrite growth in moderate degree. Thus, in our preferred practice we use moisture-containing argon for this purpose, producing it by mixing dry argon in about equal proportions with moist argon obtained by transpiring water vapor in a stream of argon at room temperature.

Likewise, briefly described, a laminate product of this invention comprises a carrier coated with a release agent, a layer of copper up to 80 microns thick on the release agent, a vapor deposited ultra-thin film of zinc, aluminum, tin or chromium on the copper layer and a vapor deposited ultra-thin layer of silica or alumina on the surface of the vapor deposited film. Preferably, the copper layer is in the form of a vapor deposited ultra-thin film. Further, it will be understood that this product has utility for various purposes including the production of copper-clad laminates for PCB production particularly when the copper film is ultra-thin so that high resolution patterns can be readily produced by semi-additive or subtractive methods. In the latter event, the carrier together with the release layer is stripped off the copper film surface after a substrate is bonded to the assembly. In the case of thicker copper film laminates and products like that of FIG. 6, conventional printed circuit boards can readily be made, particularly by subtractive techniques, as the surface of the copper body is exposed for such processing on removal of the carrier or when a carrier is not employed, as in making the FIG. 6 laminate.

DETAILED DESCRIPTION OF THE INVENTION

Figure 1:
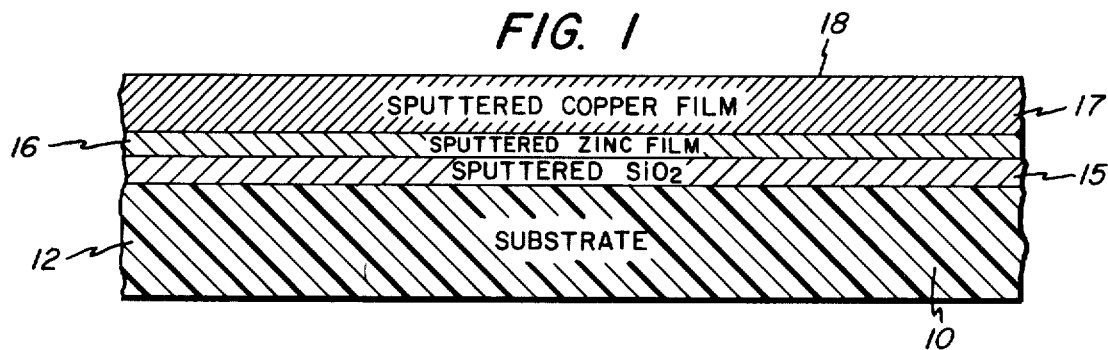
FIG. 1 is a schematic diagram representing a cross-sectional view of a laminate product of this invention including the substrate.

As illustrated in FIG. 1, the product of this invention is a laminate 10 comprising a substrate 12 bearing a vapor-deposited silica film 15, an overlayer of vapor-deposited zinc as a film 16 and a second overlayer of vapor-deposited copper film 17 having an exposed top surface 18. The interface zone between films 16 and 17 is actually brass alloy gradation formed during the heating of this assembly as substrate 12 was being bonded to the several assembled layers. The surface of the other side of the zinc film is characterized by the presence of fine whisker-like dendrites in moderate population distributed more or less uniformly in random orientation over the film surface.

Figure 2:
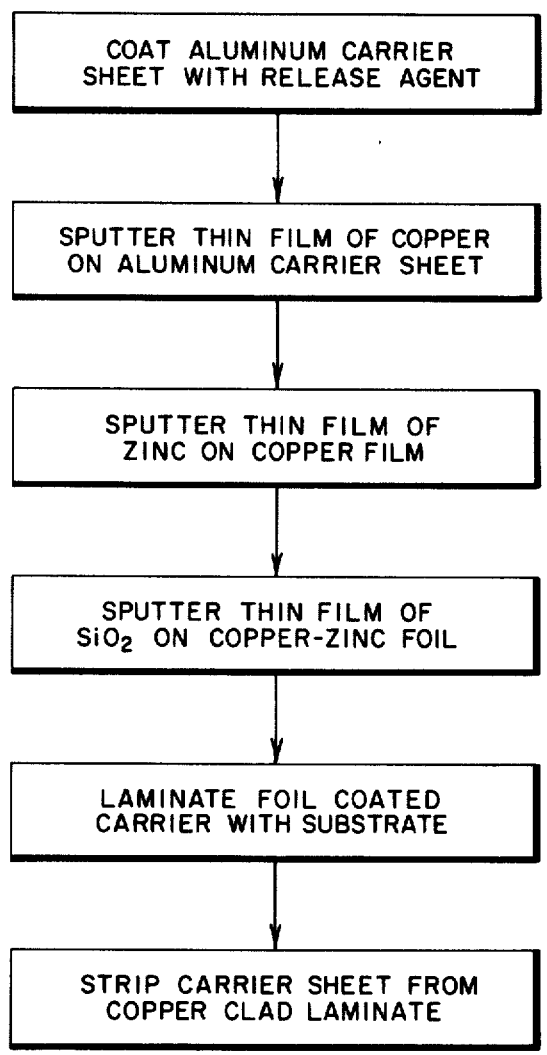
FIG. 2 is a flow diagram illustrating the steps to be followed in practicing the method of this invention in preferred form to produce the copper-clad laminate product of FIG. 1.

FIG. 2 illustrates the preferred method of this invention. First an aluminum carrier sheet preferably of thickness from 1 to 7 mils, but possibly thinner or even much thicker, is coated with a suitable substance which tends to form a relatively weak bond with copper. Such substances known and designated herein as release agents as described above are silicon dioxide, silicon oxide or soda-lime window glass or other materials capable of serving this purpose satisfactorily. The coating of silicon dioxide may be applied by sputtering, chemical vapor deposition or electron beam evaporation techiques known to those skilled in the art.

Once the aluminum carrier sheet is suitably coated in this manner, a copper coating is applied thereto by sputtering or other vapor deposition process. The deposited coat is suitably an ultra-thin film but may be much thicker to about 80 microns, depending upon the ultimate use to be made of the article. The advantage of vapor deposition is that a smooth, continuous and virtually pinhole-free coat of copper will result, even when the sections are of extreme thinness.

As the next step in the process an ultra-thin zinc layer is applied by vapor deposition technique of choice. This layer applied directly to the copper will result eventually in the formation of brass in the interface zone between the zinc and copper films both during the $SiO_2$ deposition and the heating phase of the substrate bonding operation to be described in detail. Further, in the preferred practice of this invention the zinc layer will be formed in the presence of a comparatively small amount of moisture which is sufficient, however, to result in formation of whisker-like dendrites in the resulting film surface.

A layer of silica or alumina is then applied to the zinc surface, this step being carried out by vapor deposition technique, preferably sputtering, so that an ultra-thin film of the oxide material is provided substantially uniformly over the exposed surface of the zinc layer.

The assembly may next be contacted in any suitable manner with a solution of silane coupling agent as by dipping the exposed surface of the silica or alumina film in contact with a solvent solution or by brushing the solution on exposed surface of the oxide layer and subsequently evaporating the solvent to leave the coupling agent in place on the oxide layer.

In alternative practice, the coupling agent may be incorporated in the substrate so that when heat is applied during substrate lamination, the coupling agent migrates to the oxide film-substrate interface to promote bonding of the oxide film to the glass and resin components of the substrate.

The lamination step in which a substrate is attached to the assembly is accomplished in the conventional manner by pressing the surface of the silica or alumina layer against the glass epoxy prepreg sheet material of the substrate. This is done at sufficiently elevated temperature that the epoxy is in a low viscosity liquid state permitting it to flow uniformly over the exposed surface of the oxide which may or may not be coated with the silane coupling agent with resulting formation of strong attachment or bonding and peel strengths, using the standard Jaquet 90° peel test, approximately 8 pounds per inch or more.

As the final step, the aluminum carrier sheet is removed by mechanically stripping the carrier with the release agent thereon away from the laminate product. Where the release agent is silicon dioxide, silicon oxide or another suitable material it will, in accordance with this practice, be removed cleanly from the surface of the copper film so that the laminate product is then ready for use in the production of printed circuit boards or for other purposes requiring an exposed copper surface. As previously stated, the exposed surface of the copper cladding of the laminate is of relatively small grain size when the copper film is applied by the vapor deposition technique, and that surface is of such superior quality that it is ideal for printed circuit board production.

Figure 3:
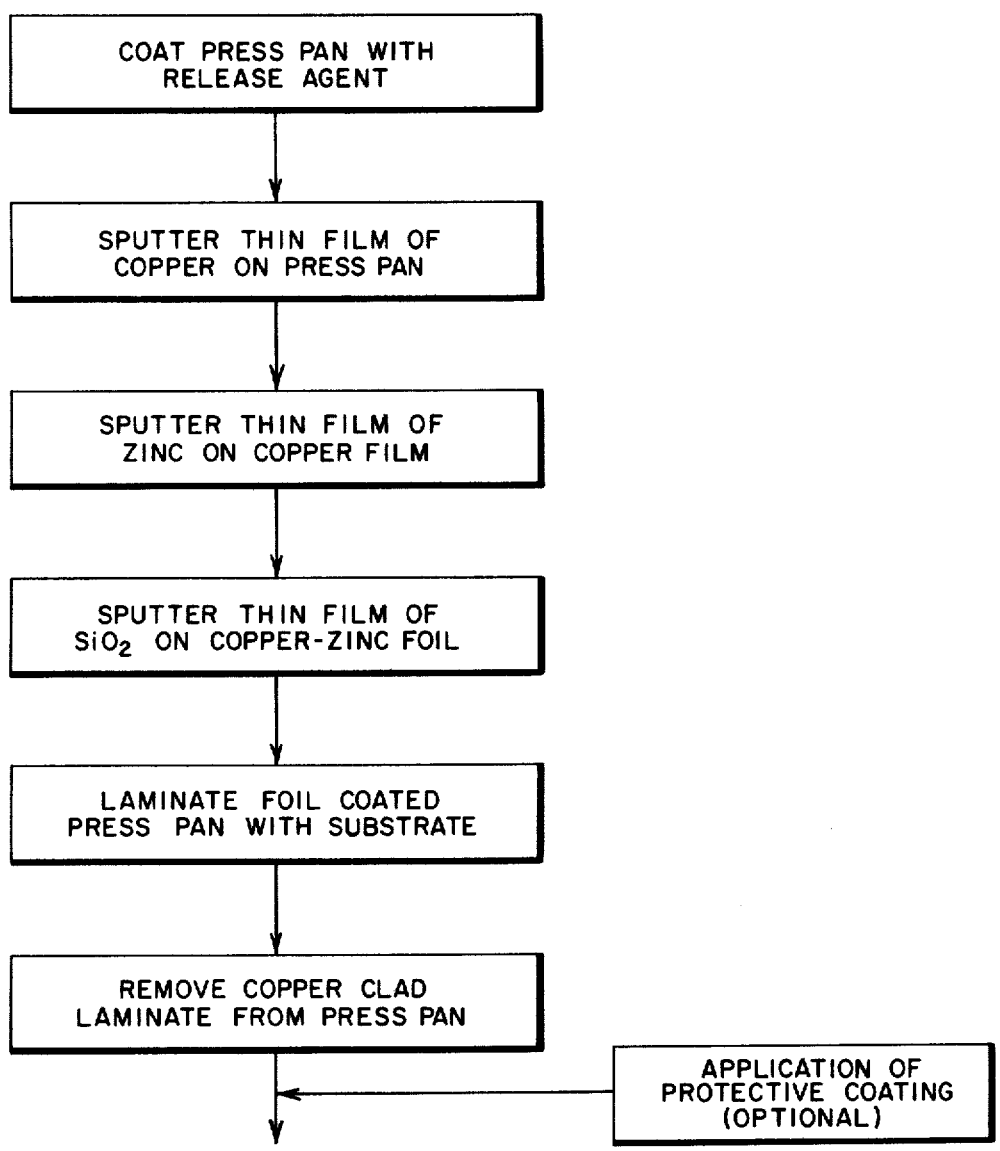
FIG. 3 is a flow diagram like that of FIG. 2 illustrating the steps to be followed in an alternative practice of the method of this invention to produce such a laminate product.

FIG. 3 illustrates an alternative embodiment of this invention method in which a stainless steel press pan is used in place of the aluminum carrier sheet of the process of FIG. 2. The difference between these two processes is therefore reflected primarily in the final step of withdrawing the press pan from the laminate product as opposed to having to mechanically strip the aluminum carrier therefrom. In all other respects, however, the processes are quite similar with the exception that stripping is done at the time of lamination instead of at the conclusion of production, the press pan being recycled, and with the further exception that after the laminate is removed from the press pan, the surface of the laminate may be given a peelable or etchable metallic or polymeric physically protective coating because of its fragile nature. The latter is the second optional step indicated in FIG. 3.

Figure 4:
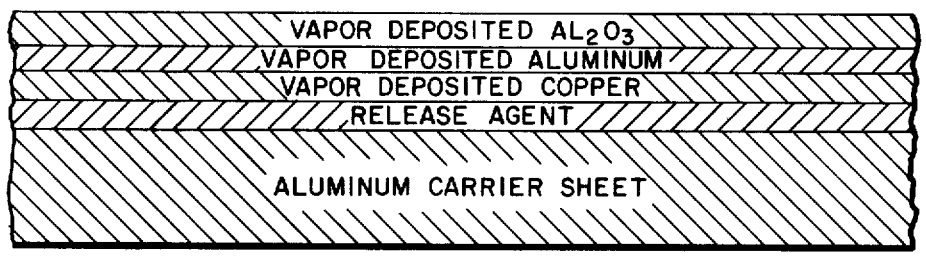
FIG. 4 is a schematic diagram representing a cross-sectional view of another product according to the present invention.
Figure 5:
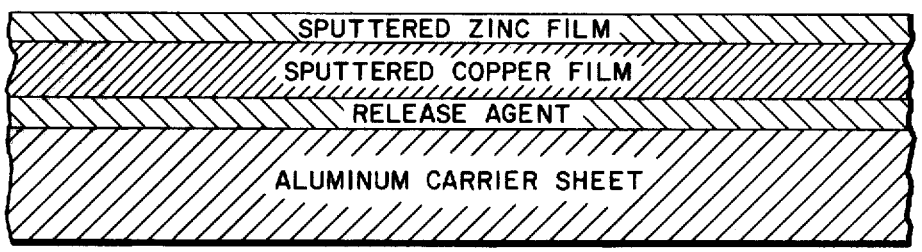
FIG. 5 is a schematic diagram representing a cross-sectional view of still another product according to the present invention.
Figure 6:
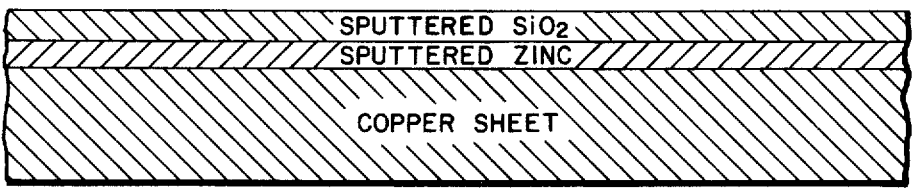
FIG. 6 is another diagram like that of FIG. 1 of another laminate product of this invention.
Figure 7:
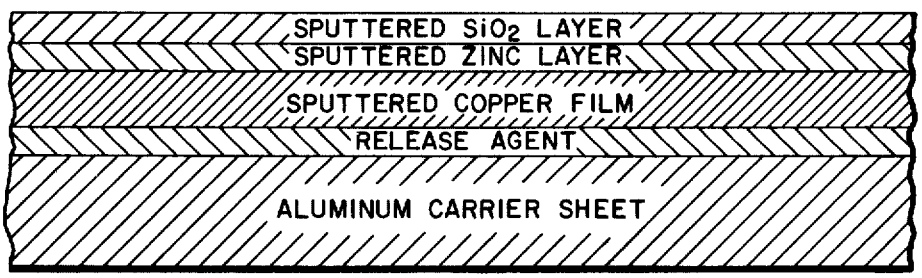
FIG. 7 is another diagram like that of FIGS. 4 and 5 of still another product of this invention.

Those skilled in the art will understand that commercialization of this invention can be accomplished in various ways. Thus, manufacturers may find it convenient to market the product illustrated in FIG. 4 which comprises an aluminum carrier sheet coated with a suitable release agent, with a copper film, with an aluminum film overlying the copper film and an alumina film overlying the aluminum film. As an alternative, the product may comprise an aluminum carrier sheet and release agent coating with a copper film overlying the coating and with a zinc film in place of the aluminum film, as illustrated in FIG. 5. As still another alternative, the produce may be that shown in FIG. 6 comprising a thin copper sheet bearing a sputtered zinc film and a sputtered $SiO_2$ film overlying the zinc film. Another product shown in FIG. 7 is like that of FIG. 5 except that a sputtered $SiO_2$ layer of film overlies the zinc. These four products are all useful in producing copper-clad laminates for ultimate use in fabricating circuit boards. Purchasers, of course, could easily proceed with these intermediate products to the ultimate fabrication of copper-clad printed circuit boards suitably along the lines described immediately above.

The following are examples of the practices of the present invention as it has en actually carried out, the results obtained being detailed in each instance.

EXAMPLE I

Ten-micron sputtered copper films were formed on four 7-mil aluminum sheets bearing sputtered 570-Angstrom coatings of silicon dioxide as a release agent. A 5,000-Angstrom zinc film was provided on the copper film surface of each of these specimens by sputtering in a vacuum chamber under an argon atmosphere containing moisture in which the pressure of argon was approximately 10 microns and was more than tenfold greater than the moisture pressure. A layer of silica in the form of a 660-Angstrom film was applied to each of these specimens again by means of sputtering technique and coupling agent solutions were brushed on three of these specimens to promote bonding and adhesion between the copper-zinc laminate structure and the glass epoxy substrate to be applied in the next step of the process. The coupling agent used on the first specimen was one known in the trade as A186 and has the chemical identity of Beta (3,4 epoxy cyclohexyl) ethyl trimethoxy silane. This coupling agent was applied as an anhydrous methanol solution, the methanol being allowed to evaporate in air before the substrate bonding step was carried out. The second specimen had applied to it coupling agent known as A187 which has the chemical identity Gamma glycidoxy propyl trimethoxy silane which was as in the case of the first specimen applied to the silica coating in the form of a methanol solution, the methanol being evaporated to leave the coupling agent residue on the surface of the silica film. The third specimen was similarly treated with coupling agent A1100 known as Gamma (amino) propyl triethoxy silane. The fourth specimen was not treated with a coupling agent. Lamination was accomplished in each instance by placing a glass epoxy prepreg sheet which in cured form is known in the trade as FR4 board against the specimens with the silica coating facing the prepreg sheet and applying pressure of about 160 psi while maintaining a temperature of about 170° for 40 minutes in which time curing was fully accomplished. Following cooling and removal of the specimens in each instance from the lamination press, aluminum carriers were stripped from the laminated assembly leaving the finished product. The peel strength of the A186 treated specimen was measured at between 7.2 and 8.0 pounds per inch, while that of the A187 treated specimen was 8.0 pounds per inch and that of the A1100 treated specimen was 7.2 to 8.0 pounds per inch. The specimen not treated with a coupling agent measured 8.0 to 8.8 pounds per inch peel strength.

EXAMPLE II

In another experiment like that of Example I, the same exact peel strength was measured for the A186 treated specimen but the others in the series measured significantly less than their counterparts in Example I, the A187 treated specimen showing a peel strength of 5.6 pounds per inch, that of the A1100 treated specimen being 4.8 to 7.2 pounds per inch and that of the specimen not treated with a coupling agent measured 5.6 to 6.8 pounds per inch.

EXAMPLE III

Ten-micron sputtered copper films were formed on twelve 3-mil aluminum sheets bearing 200-Angstrom coatings of $SiO_2$ as a release agent. Zinc overcoats were applied to the copper surfaces of these specimens by sputtering for varying times at the same 100 watt power input so that four had 5,000-Angstrom zinc films, four others had 2,500-Angstrom zinc films and the other four had 1,200-Angstrom zinc films. A 660-Angstrom film of $SiO_2$ was applied to each of two specimens of each of these three series while a 330-Angstrom $SiO_2$ film was applied to the other two specimens of each series, the same 100 watt power being used in all cases and the sputtering time was fixed at 20 minutes and 10 minutes, respectively, to produce the desired film thicknesses. A ½% methanol solution of coupling agent A186 was then brushed on one of each pair of the 660-Angstrom and 330-Angstrom $SiO_2$ coated specimens of the 5,000-Angstrom and 2,500-Angstrom zinc film series, the other members of each pair being left untreated in that respect. Likewise, one of each of the two pair of the 1,200-Angstrom zinc film series were not treated with the coupling agent while the others of each pair were brushed with a 2% methanol solution of coupling agent A1100. Following substrate lamination according to Example I, peel strength tests were performed as described above resulting in measurements of 5.6 to 6.0 and 6.4 pounds per inch respectively for the untreated and treated 660-Angstrom $SiO_2$ film and 5,000-Angstrom zinc film specimens. The other two 5,000-Angstrom zinc film specimens (330-Angstrom $SiO_2$ film) untreated and treated measured in pounds per inch 6.4 to 7.4 and 6.8 to 7.2, respectively. Both the untreated specimens of the second series (2,500-Angstrom zinc film) and the treated 330-Angstrom $SiO_2$ film series measured the same as 6 pounds per inch while the treated 660-Angstrom $SiO_2$ film specimen measured 6.4 to 7.2 pounds per inch. The untreated specimens of the third series (1,200-Angstrom zinc film) exhibited substantially greater peel strengths at 6.8 to 7.6 and 6.0 to 6.4 against 2.0 to 5.2 and 4.0 pounds per inch for the treated 660-Angstrom and 330-Angstrom SiO$_2$ films, respectively.

EXAMPLE IV

In another experiment like that of Example III, 10-micron sputtered copper films were formed on four 7-aluminum sheets each of which was coated with a 570-Angstrom SiO$_2$ film. Zinc films were applied to the exposed copper films surfaces by sputtering at power input of 100 watts for intervals of 20 to 5 minutes, respectively, to provide films of different thicknesses, I.e., 14,000 Angstroms, 7,000 Angstroms, 5,250 Angstroms and 1,200 Angstroms. In each of these zinc deposition operations moisture was provided in the sputtering atmosphere of argon as about one-half the argon was transpired through water at room temperature while the rest of the argon of each run was delivered in dry condition into the sputtering chamber. A 660-Angstrom SiO$_2$ film was then applied to three of these specimens while the zinc film on the other (3,500 Angstrom) was coated with a film of SiO$_2$ only 200 Angstrom thick. Each resulting silica film surface was brushed with a ½% ethanol solution of A186 coupling agent and after evaporation of the alcohol, the assembly was laminated with a substrate and measured for peel strengths, all as described above. The peel strength of the 14,000-Angstrom zinc coated specimen was well below the acceptable level being less than 2 pounds per inch, while the 7,000-Angstrom zinc coated specimen measured well in the acceptable range at 7.3 to 8.8 pounds per inch. The 5,250-Angstrom zinc specimen measured at 6.0 to 6.8 pounds per inch and the 3,500-Angstrom specimen exhibited a peel strength of 7.6 pounds per inch.

EXAMPLE V

In another experiment like those of the foregoing examples aluminum was used in place of zinc and three specimens were prepared with 5,000 Angstrom thick aluminum films being established under argon atmosphere of 10 microns pressure and moisture pressure of 1 micron. Again, the silica was of the specification stated in the foregoing examples and to the first two specimens A186 and A187 coupling agents were applied, respectively, while on the third specimen no coupling agent was used. The peel test performed on the specimens following glass epoxy prepreg sheet bonding as described in Example I and following removal of the aluminum carrier strip and release agent, measured 4.8 pounds per inch for each of the first two specimens and 5.6 pounds for the untreated specimen.

EXAMPLE VI

In an experiment precisely the same as that set out in Example V, with the exception of the fact that the argon atmosphere was substantially anhydrous, containing less than 1 part per thousand of moisture, the three specimens prepared were found on tests as described in Example IV to have precisely the same peel strengths at 5.2 pounds per inch.

EXAMPLE VII

In another experiment like that of Example VI, four specimens were prepared using window glass instead of silica as the coating for the aluminum film over the copper film. The finished products corresponding to those above measured 5.2 pounds per inch peel strength in the case of the A186-treated specimen, 5.6 pounds per inch for the A187-treated specimen and 5.2 to 5.6 pounds per inch for the A1100-treated specimen and finally 6.8 pounds per inch for the untreated specimen.

What is claimed is:

1. A metal-clad laminate comprising a substrate, a layer of copper and bonding means located between said substrate and said copper layer for bonding said substrate and copper layer together, said bonding means consisting of an ultra-thin film of zinc on said copper layer together with an ultra-thin film of oxide selected from the group consisting of aluminum oxide and silicon dioxide disposed between and in contact with said zinc film and said substrate.

2. The invention of claim 1 in which the copper layer is present as vapor deposited film of thickness less than about 16 microns.

3. The invention of claim 1 in which the oxide is silicon dioxide.

4. A laminate product comprising a thin copper sheet, an ultra-thin film of zinc vapor deposited on said copper sheet and a film of silica vapor deposited on said zinc film.

5. The laminate product of claim 4 in which a portion of the surface of the zinc film between the zinc and the silica is characterized by the presence of whisker-like dendrites of zinc.

6. The invention of claim 4 in which a coating of silane coupling agent is located over the silica film.

* * * * *